(12) United States Patent
Liebenberg et al.

(10) Patent No.: US 10,299,361 B2
(45) Date of Patent: May 21, 2019

(54) OPTICAL PULSE GENERATION FOR AN EXTREME ULTRAVIOLET LIGHT SOURCE

(71) Applicant: ASML Netherlands B.V., Veldhoven (NL)

(72) Inventors: Christoffel Johannes Liebenberg, San Marcos, CA (US); Robert William Parry, Reno, NV (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/469,267

(22) Filed: Mar. 24, 2017

(65) Prior Publication Data

US 2018/0279458 A1 Sep. 27, 2018

(51) Int. Cl.
| | |
|---|---|
| H05G 2/00 | (2006.01) |
| G03F 7/20 | (2006.01) |
| H01S 3/00 | (2006.01) |
| G02F 1/015 | (2006.01) |

(52) U.S. Cl.
CPC ............. *H05G 2/008* (2013.01); *G02F 1/015* (2013.01); *G03F 7/70033* (2013.01); *G03F 7/70041* (2013.01); *G03F 7/70566* (2013.01); *H01S 3/0085* (2013.01); *G02F 2001/0151* (2013.01); *G02F 2202/10* (2013.01); *G03F 7/70558* (2013.01); *H01S 3/0057* (2013.01)

(58) Field of Classification Search
None
See application file for complete search history.

(56) References Cited

U.S. PATENT DOCUMENTS

| | | | |
|---|---|---|---|
| 4,221,463 | A | 9/1980 | Barsack et al. |
| 7,525,711 | B1 | 4/2009 | Rule et al. |
| 7,652,258 | B2 | 1/2010 | Shahar et al. |
| 8,884,228 | B2 | 11/2014 | Washington, II et al. |
| 9,357,625 | B2 | 5/2016 | Tao et al. |

(Continued)

FOREIGN PATENT DOCUMENTS

| | | | |
|---|---|---|---|
| JP | 2013174744 A | * | 9/2013 |
| WO | 2016067343 A1 | | 5/2016 |

OTHER PUBLICATIONS

Simi A. George et al. "13.5 nm EUV generation from tin-doped droplets using a fiber laser," Opt. Express 15, 16348-16356 (2007).*

(Continued)

*Primary Examiner* — James Choi
(74) *Attorney, Agent, or Firm* — DiBerardino McGovern IP Group LLC

(57) ABSTRACT

An optical pulse for an extreme ultraviolet (EUV) light source may be formed by illuminating a semiconductor material of a modulation system with a first light beam having a first wavelength; applying a voltage to the semiconductor material for a time duration, the applied voltage being sufficient to modify an index of refraction of the semiconductor material such that a polarization state of a light beam having a second wavelength passing through the semiconductor material is modified to pass through at least one polarization-based optical element of the modulation system; and forming an optical pulse by passing a second light beam having the second wavelength through the semiconductor material during the time duration.

27 Claims, 13 Drawing Sheets

(56) References Cited

U.S. PATENT DOCUMENTS

| | | |
|---|---|---|
| 2004/0052456 A1 | 3/2004 | Boffi et al. |
| 2005/0083566 A1 | 4/2005 | Zappettini et al. |
| 2010/0127191 A1* | 5/2010 | Partlo .................. H05G 2/003 250/504 R |
| 2011/0109972 A1 | 5/2011 | Ullrich et al. |
| 2012/0238111 A1 | 9/2012 | Jennings et al. |
| 2014/0203194 A1 | 7/2014 | Nagano et al. |
| 2014/0233005 A1* | 8/2014 | Crouch .................. H05G 2/008 355/67 |
| 2014/0376574 A1 | 12/2014 | Skrabelj et al. |
| 2016/0007434 A1 | 1/2016 | Tao et al. |
| 2017/0181259 A1 | 6/2017 | Nogiwa |

OTHER PUBLICATIONS

Babalola, "Surface and Bulk Defects in Cadmium Zinc Telluride and Cadmium Manganese Telluride Crystals," Graduate School of Vanderbilt University, Nashville, TN, Dec. 2009, 153 total pages.

Bell, "Review of optical applications of CdTe," Revue de Physique Appliquee, Jan, 1, 1977, 12 (2), pp. 391-399, 10 total pages, <10.1051/rphysap:01977001202039100>, <jpa-00244180>.

Castaldini et al., "Deep energy levels in CdTe and CdZnTe," Journal of Applied Physics, vol. 83, No. 4, Feb. 15, 1998, 7 total pages.

Duff et al., "Use of Sub-bandgap Illumination to Improve Radiation Detector Resolution of CdZnTe," Savannah River National Laboratory, Aiken, SC, Fisk University, Nashville, TN, 2009, 19 total pages.

Shwartz et al., "Persistent light-induced change in the effective band gap and reversible control over the effective band gap in bulk semiconductor crystals," Physical Review B 83, 241201(R), 2011 American Physical Society, received May 4, 2011, published Jun. 16, 2011, 4 total pages.

Shwartz et al., "Light-induced ionic polarization in CdZnTe:V semiconductor crystals as a source of giant enhancement of non-linear effects," Physical Review B 79, 193202, 2009 American Physical Society, received Dec. 23, 2008, revised received Feb. 27, 2009, published May 6, 2009, 4 total pages.

Teague et al., "Photoinduced Currents in CdZnTe Crystals as a Function of Illumination Wavelength," Savannah River National Laboratory, Aiken, SC, Fisk University, Nashville, TN, 2012, 16 total pages.

Yang et al., "Opto-Electrical Characterization and X-Ray Mapping of Large-Volume Cadmium Zinc Telluride Radiation Detectors," 2009, Brookhaven National Laboratory, Upton, NY, BNL-90172-2009-CP, 8 total pages.

Shane Thomas, U.S. International Searching Authority, International Search Report and Written Opinion, counterpart PCT Application No. PCT/US2018/023094, dated Jul. 30, 2018, 14 pages total.

\* cited by examiner

OPTICAL PULSE GENERATION FOR AN EXTREME ULTRAVIOLET LIGHT SOURCE

TECHNICAL FIELD

This disclosure relates to optical pulse generation for an extreme ultraviolet light source.

BACKGROUND

Extreme ultraviolet ("EUV") light, for example, electromagnetic radiation having wavelengths of around 50 nm or less (also sometimes referred to as soft x-rays), and including light at a wavelength of about 13 nm, may be used in photolithography processes to produce extremely small features in substrates, for example, silicon wafers.

Methods to produce EUV light include, but are not necessarily limited to, converting a material that has an element, for example, xenon, lithium, or tin, with an emission line in the EUV range in a plasma state. In one such method, often termed laser produced plasma ("LPP"), the required plasma may be produced by irradiating a target material, for example, in the form of a droplet, plate, tape, stream, or cluster of material, with an amplified light beam that may be referred to as a drive laser. For this process, the plasma is typically produced in a sealed vessel, for example, a vacuum chamber, and monitored using various types of metrology equipment.

SUMMARY

In one general aspect, a method of forming an optical pulse for an extreme ultraviolet (EUV) light source includes illuminating a semiconductor material of a modulation system with a first light beam having a first wavelength; applying a voltage to the semiconductor material for a time duration, the applied voltage being sufficient to modify an index of refraction of the semiconductor material such that a polarization state of a light beam having a second wavelength passing through the semiconductor material is modified to pass through at least one polarization-based optical element of the modulation system; and forming an optical pulse by passing a second light beam having the second wavelength through the semiconductor material during the time duration. The formed optical pulse includes a first portion and a second portion, the first portion and the second portion being temporally contiguous, the first portion occurring before the second portion, and illuminating the semiconductor material of the modulation system with the first light beam modifies one or more characteristics of the first portion of the formed optical pulse.

Implementations may include one or more of the following features. The one or more characteristics of the first portion of the optical pulse may include one or more of an average intensity, a maximum intensity, and a temporal duration. The formed pulse may be allowed to propagate toward a target region, and the first portion of the formed pulse may have a maximum intensity that is less than a maximum intensity of the second portion of the formed pulse. The maximum intensity of the second portion may be sufficient to convert target material in a target at the target region to a plasma that emits EUV light.

The second wavelength may be at least three times greater than the first wavelength.

The semiconductor material may be associated with a spectral transmission characteristic, the spectral transmission characteristic including a transmission region and an absorption edge wavelength, the absorption edge wavelength being the lowest wavelength on the transmission region, the first wavelength is between the absorption edge wavelength and the second wavelength, and the second wavelength may be a wavelength in the transmission region. The second wavelength is no more than 3.5 times greater than the first wavelength.

The semiconductor material may be associated with a band gap energy, the band gap energy being an energy difference between a valence band of the semiconductor material and a conduction band of the semiconductor material, and the photon energy of the first wavelength may be less than the band gap energy. The semiconductor material may include defects, the defects creating deep-level traps with energy levels between the valence band and the conduction band, and the photon energy of the first wavelength may be equal to or greater than an energy difference between at least one energy level of a deep-level trap and the conduction band or between at least one energy level of a deep-level trap and the valence band.

The second wavelength may include 10.6 µm, and the semiconductor material may be one of cadmium zinc telluride (CdZnTe), cadmium telluride (CdTe), zinc telluride (ZnTe), and gallium arsenide (GaAs). The first wavelength may be a wavelength between 0.75 microns (µm) and 3.5 µm, and the second wavelength may include a wavelength between 9 µm and 11 µm.

The first light beam and the second light beam may follow the same spatial path through the semiconductor material. The first light beam and the second light beam may be in the semiconductor material at the same time.

A property of the first light beam may be adjusted to adjust one or more of the characteristics of the first portion of the optical pulse. Adjusting the property of the first light beam may include increasing an intensity of the first light beam to reduce a maximum or average intensity of the first portion of the optical pulse.

In another general aspect, a system for an extreme ultraviolet (EUV) light source includes a modulation system including a semiconductor material, the semiconductor material including one or more types of defects, an index of refraction of the semiconductor material varying in response to application of voltage; a first light source configured to produce a first light beam having a first wavelength, where illuminating the semiconductor material with light having the first wavelength increases a leakage current of the semiconductor material; and a control system coupled to the modulation system, the control system configured to cause a voltage to be applied to the semiconductor material while a second light beam having a second wavelength propagates in the semiconductor material to form an optical pulse from the second light beam, the optical pulse configured to convert at least some target material to plasma that emits EUV light.

Implementations may include one or more of the following features. The pulse may include a first portion and a second portion, the first portion and the second portion being temporally contiguous, and the first portion occurring before the second portion.

The modulation system also may include at least one polarization-based optical element. The semiconductor material may be a crystal. The second light beam may be a continuous light beam. The types of defects may include one or more of precipitates, inclusions, twins, and slip-planes.

The second light source may include a pulsed light source, the control system may be coupled to the modulation system and the second light source, and the control system may be configured to control the second light source to emit a pulse of light. The control system also may be configured to control the second light source to direct a pulse of the second light beam toward the semiconductor material while the voltage is applied to the semiconductor material and while the first light beam is directed toward the semiconductor material. At least one pulse of the first light beam and the second light beam may be in the semiconductor material at the same time.

The control system also may be configured to control the first light source to thereby control one or more characteristics of the first portion of the optical pulse. The one or more characteristics of the first portion may include one or more of an average intensity, a maximum intensity, and a temporal duration. The control system may be configured to control an intensity of the first portion of the pulse by controlling the first light source.

The system for the EUV light source also may include an optical beam delivery system between the first light source and the semiconductor material, the optical beam delivery system being configured to direct the first light beam to a particular location on the semiconductor material.

In another general aspect, a method of modifying an acoustic effect in an electro-optic modulator includes applying a voltage to a semiconductor of the electro-optic modulator during a first time period, the application of the voltage generating an acoustic effect in the semiconductor, the acoustic effect including an oscillating acoustic wave; and illuminating the semiconductor with a seed light beam, the seed light beam having a wavelength that has a photon energy that is less than a band gap energy of the semiconductor to thereby modify one or more of an amplitude and a frequency of the acoustic wave.

Implementations may include one or more of the following features. A continuous wave light beam may be directed toward semiconductor of the electro-optic modulator, where a first amount of the continuous wave light beam passes through the electro-optic modulator with a first polarization state during the first time period while the voltage is applied to the semiconductor, a second amount of the continuous wave light beam passes through the electro-optic modulator at a time not in the first time period when the voltage is not applied to the semiconductor and the acoustic effect is present in the semiconductor, and illuminating the semiconductor with the seed light beam changes the second amount of the light beam that passes through the electro-optic modulator.

A pulse of a pulsed light beam may be directed toward the electro-optical modulator, a first amount of light of the pulse passing through the semiconductor during the first time period when the voltage is applied to the semiconductor, and a second amount of light of the pulse passing through the semiconductor during a time that is not in the first time period and when the voltage is not applied to the semiconductor, where illuminating the semiconductor with the seed light beam changes the second amount of light.

Implementations of any of the techniques described above may include an EUV light source, a system, a method, a process, a device, or an apparatus. The details of one or more implementations are set forth in the accompanying drawings and the description below. Other features will be apparent from the description and drawings, and from the claims.

DRAWING DESCRIPTION

DETAILED DESCRIPTION

Techniques for forming an optical pulse in an extreme ultraviolet (EUV) light source are discussed. An electro-optic modulator used to form the optical pulse is illuminated with a seed light beam to liberate trapped electrical charges in a semiconductor of the electro-optic modulator. The charges become trapped due to defects that are present in the semiconductor, and the trapped charges increase the optical leakage of the modulator. The optical leakage contributes additional or spurious light to the pulses formed by the modulator. Some of this spurious light forms a "pedestal" at the beginning of the formed pulse. By liberating the trapped charges, the optical leakage is reduced and/or controlled, and the pedestal also may be reduced and/or controlled.

Figure 1:
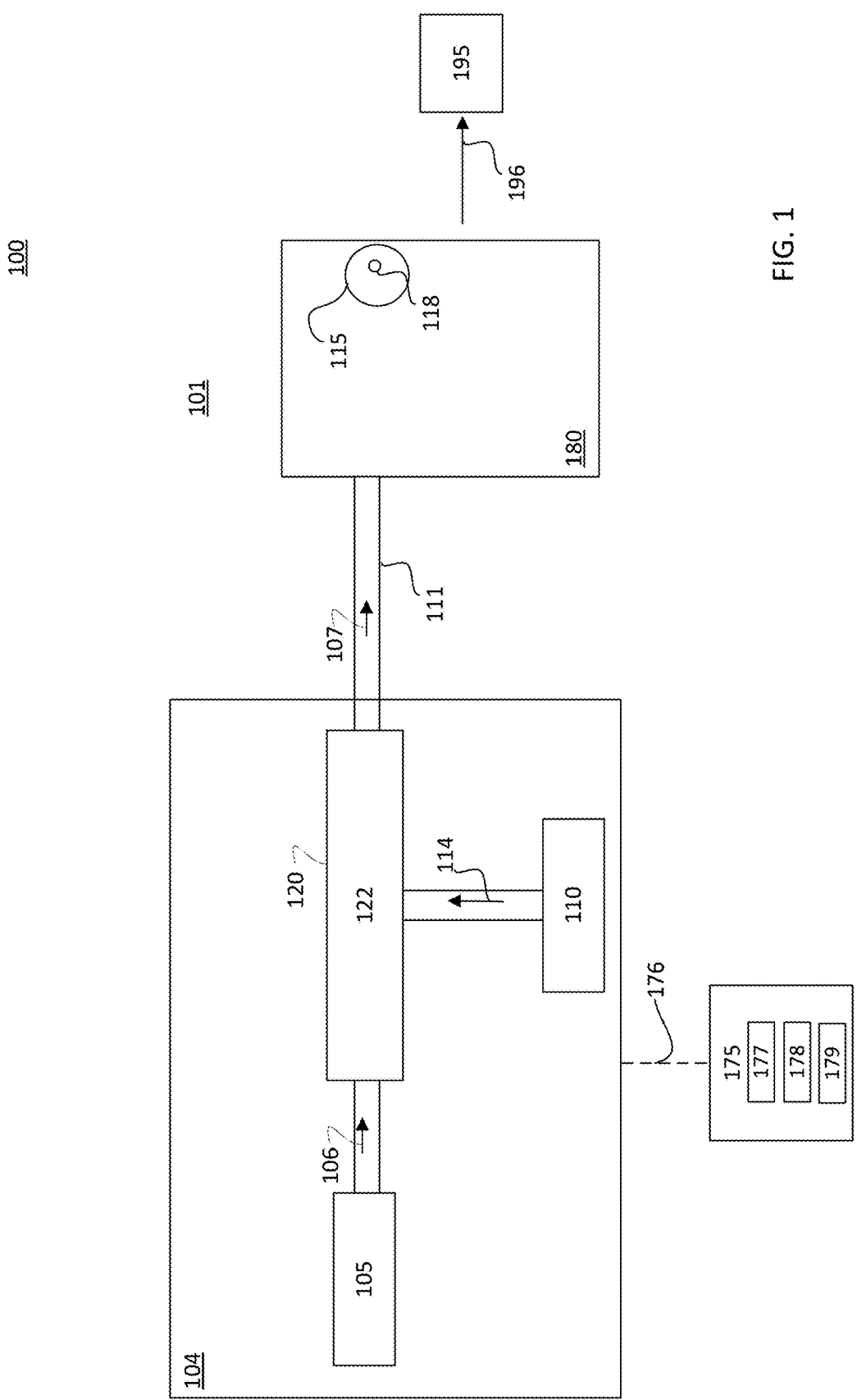
FIG. 1 is a block diagram of an example of an extreme ultraviolet (EUV) lithography system that includes an EUV light source.

Referring to FIG. 1, a block diagram of a system 100 is shown. The system 100 is an example of an EUV lithography system. The system 100 includes an EUV light source 101, which provides EUV light 196 to a lithography apparatus 195. The lithography apparatus 195 exposes a wafer (for example, a silicon wafer) with the EUV light 196 to form electronic features on the wafer. The EUV light 196 is emitted from a plasma that is formed by irradiating target material in a target 118 with an optical pulse 107. The target material is any material (for example, tin) that emits EUV light in a plasma state.

The EUV light source 101 includes a pulse generating system 104, which produces the pulse 107. The pulse generating system 104 includes a light source 105, which may be, for example, a pulsed (for example, a Q-switched) or continuous-wave carbon dioxide ($CO_2$) laser. The light source 105 produces a light beam 106, which may be a train of pulses of light or a continuous light beam. The light source 105 emits the light beam 106 toward a modulation module 120 that includes a semiconductor 122.

The modulation module 120 is an electro-optic modulator that modulates an incident light beam based on the electro-optic effect. The electro-optic effect describes the change in the refractive index of a material (the semiconductor 122) resulting from the application of a direct-current (DC) or low-frequency electric field. The modulation module 120 is controlled by a control system 175 to form the pulse 107 from the light beam 106 or from a pulse of light of the light beam 106. The pulse 107 propagates on a path 111 toward a vacuum vessel 180, which receives the target 118. The pulse 107 and the target 118 interact at a target region 115 in the vacuum vessel 180, and the interaction converts at least some of the target material in the target 118 into plasma that emits the EUV light 196.

The EUV light source 101 also includes a seed light source 110. The seed light source 110 emits a seed light beam 114, which illuminates the semiconductor 122. The semiconductor 122 includes defects, which may trap electrical charges. The seed light beam 114 has a wavelength associated with a photon energy that is sufficient to excite the trapped charges and may migrate the trapped charges to a conduction band of the semiconductor 122, increasing the conductivity of the semiconductor 122. As discussed in greater detail below with respect to FIGS. 2-12, removing or reducing the trapped charges improves the ability of the modulation module 120 to form the pulse 107.

The control system 175 exchanges data and/or information with the pulse generating system 104 and/or any of the components of the pulse generating system 104 via a communications interface 176. For example, in some implementations, the control system 175 may provide trigger signals to operate the modulation module 120 and/or the light source 105. The control system 175 includes an electronic processor 177, an electronic storage 178, and an input/output (I/O) interface 179. The electronic processor 177 includes one or more processors suitable for the execution of a computer program such as a general or special purpose microprocessor, and any one or more processors of any kind of digital computer. Generally, an electronic processor receives instructions and data from a read-only memory, a random access memory, or both. The electronic processor 177 may be any type of electronic processor.

The electronic storage 178 may be volatile memory, such as RAM, or non-volatile memory. In some implementations, and the electronic storage 178 includes non-volatile and volatile portions or components. The electronic storage 178 may store data and information that is used in the operation of the control system 175 and/or components of the control system 175.

The electronic storage 178 also may store instructions, perhaps as a computer program, that, when executed, cause the processor 177 to communicate with components in the control system 175, the modulation module 120, and/or the light source 105. For example, in implementations in which the source 105 is a pulsed source, the instructions may be instructions that cause the electronic processor 177 to generate a signal that results in the light source 105 emitting an optical pulse.

The I/O interface 179 is any kind of electronic interface that allows the control system 175 to receive and/or provide data and signals with an operator, the modulation module 120, and/or the light source 105, and/or an automated process running on another electronic device. For example, the I/O interface 179 may include one or more of a visual display, a keyboard, and a communications interface.

Figure 2A:
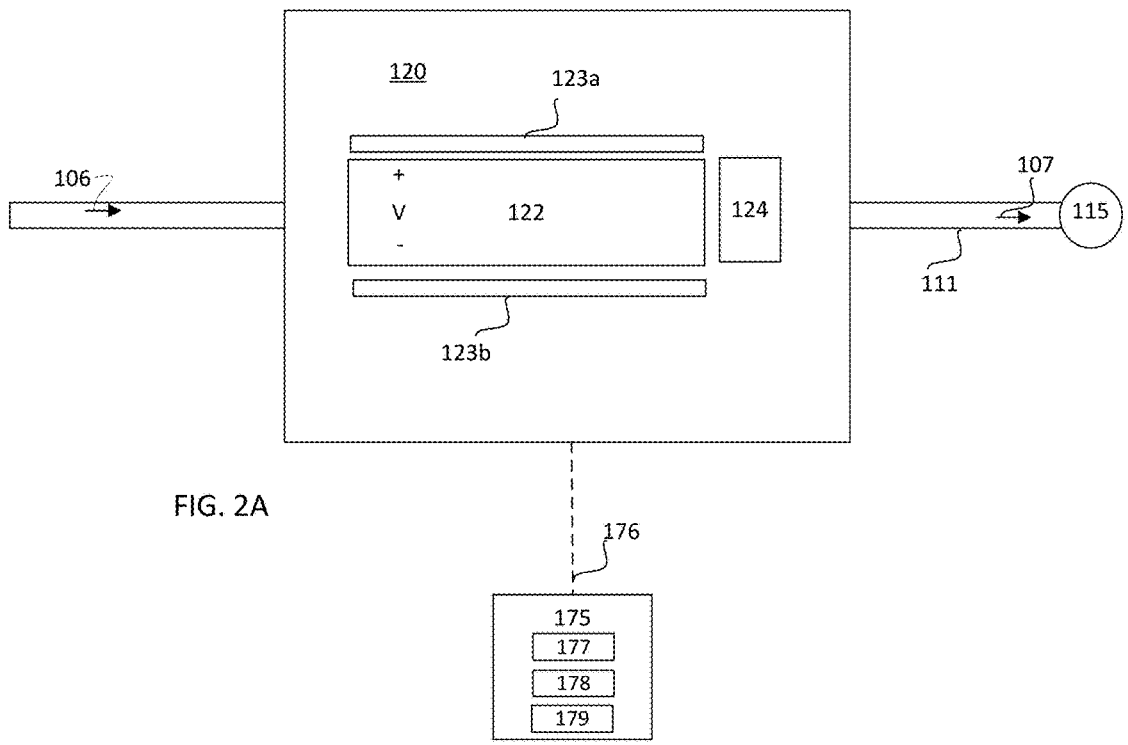
FIG. 2A is a block diagram of a modulation module used in the EUV light source of FIG. 1.

FIG. 2A is a block diagram of the modulation module 120. The modulation module 120 includes the semiconductor 122, which is positioned between electrodes 123a, 123b. The electrodes 123a, 123b are controllable to form an electric field between the electrode 123a and 123b. For example, the control system 175 may cause the electrode 123a to be held at a greater voltage than the electrode 123b, thus creating an electric field or a potential difference (V) across the semiconductor 122.

The modulation module 120 also includes one or more polarization-based optical elements 124. In the example of FIG. 2A, only one polarization-based optical element 124 is shown. However, in other implementations, additional polarization-based optical elements 124 may be included. For example, a second polarization-based optical element 124 may be on a side of the modulation module 120 that receives the light beam 106.

The polarization-based optical element 124 is any optical element that interacts with light based on the polarization state of the light. For example, polarization-based optical element 124 may be a linear polarizer that transmits horizontally polarized light and blocks vertically polarized light, or vice versa. The polarization-based optical element 124 may be a polarizing beam splitter that transmits horizontally polarized light and reflects vertically polarized light. The polarization-based optical element 124 may be an optical element that absorbs all light except for light having a particular polarization state. In some implementations, the polarization-based optical element 124 may include a quarter-wave plate. At least one polarization-based optical element 124 is positioned to receive light that passes through the semiconductor 122 and to direct light of a certain polarization state onto the beam path 111.

The semiconductor 122 may be any material that transmits one of more wavelengths of the light beam 106. The semiconductor 122 also exhibits anisotropy that can be modified by application of a controllable external force (such as the potential difference (V)). The control over anisotropy enables control over indices of refraction for different polarization components of light propagating through the semiconductor 122. For implementations in which the light beam 106 includes light of a wavelength of 10.6 microns (μm), the semiconductor 122 may be, for example, cadmium zinc telluride (CdZnTe or CZT), cadmium telluride (CdTe), zinc telluride (ZnTe), and/or gallium arsenide (GaAs). Other materials may be used at other wavelengths. For example, the semiconductor 122 may be monopotassium phosphate (KDP), ammonium dihydrogen phosphate (ADP), quartz, cuprous chloride (CuCl), zinc sulphide (ZnS), zinc selenide (ZnSe), lithium niobate (LiNbO$_3$), gallium phosphide (GaP), lithium tantalate (LiTaO$_3$), or barium titanate (BaTiO$_3$). Other materials that transmit one or more wavelengths of the light beam 106 and exhibit birefringence in response to application of an external force also may be used.

The polarization state of the light that passes through the semiconductor 122 may be controlled by controlling the potential difference (V) between the electrodes 123a, 123b. Under ideal operation, the modulation module 120 only emits light when the potential difference V applied to the semiconductor 122 causes the polarization state of the light passing through the semiconductor 122 to match the polarization-based optical element 124. For example, if the polarization-based optical element 124 is a linear polarizer positioned to transmit horizontally polarized light onto the beam path 111, and the light beam 106 is vertically polarized when initially incident on the semiconductor 122, the pulse 107 is only formed when the potential difference V applied to the semiconductor 122 changes the polarization state of the light beam 106 such that the light beam 106 is horizontally polarized.

However, in actual operation, the modulation module 120 also emits spurious light (optical leakage). This optical leakage is present throughout the operation of the modulation module 120, and causes an additional amount of light to pass through the modulation module 120, including at times when no light should pass through the modulation module 120. For example, the additional light causes an additional or extra amount at the beginning of the pulse 107, and this additional light forms the pedestal portion.

Figure 2B:
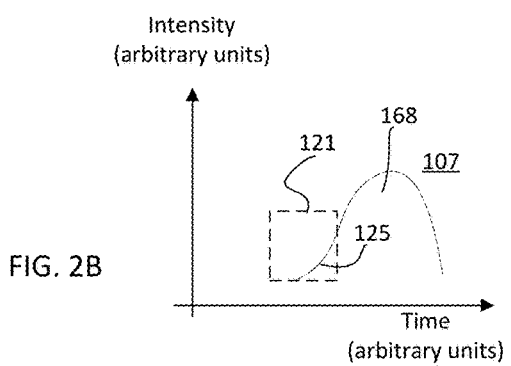
FIG. 2B is an illustration of an optical pulse.

Referring also to FIG. 2B, an illustration of the pulse 107 with a pedestal 125 is shown. FIG. 2B shows the intensity of the pulse 107 as a function of time. The pedestal 125 occurs during a window labeled as 121, and the pedestal 125 occurs earlier in time than the rest of the pulse 107. The portions of the pulse 107 that are not the pedestal 125 are referred to as the main portion 168. The pedestal 125 and the main portion 168 are both part of the pulse 107, and the pedestal 125 is temporally connected to the main portion 168.

The average and maximum intensity and optical energy of the pedestal 125 is less than the average and maximum intensity and optical energy of main portion 168. The main portion 168 has an intensity or energy sufficient to convert at least some of the target material in the target 118 into plasma that emits EUV light. The pedestal 125 does not have as much energy, and may not have sufficient energy to convert the target material into plasma. However, the light in the pedestal 125 may reflect off of the target 118, evaporate material from the surface of the target 118, and/or break off parts of the target 118.

The pedestal 125 occurs before the main portion 168 and reaches the target 118 before the main portion 168. The pedestal 125 may interfere with the plasma formation by altering the target 118 before the main portion 168 reaches the target 118 and/or cause undesirable reflections that propagate back on the path 111. As such, it is desirable to control the amount of light in the pedestal 125. Illuminating the semiconductor 122 with the seed light beam 114 also allows one or more characteristics of the pedestal 125 to be changed, controlled, reduced, or eliminated. For example, the average amount of light and/or the maximum amount of light in the pedestal 125 may be reduced.

Figure 3A:
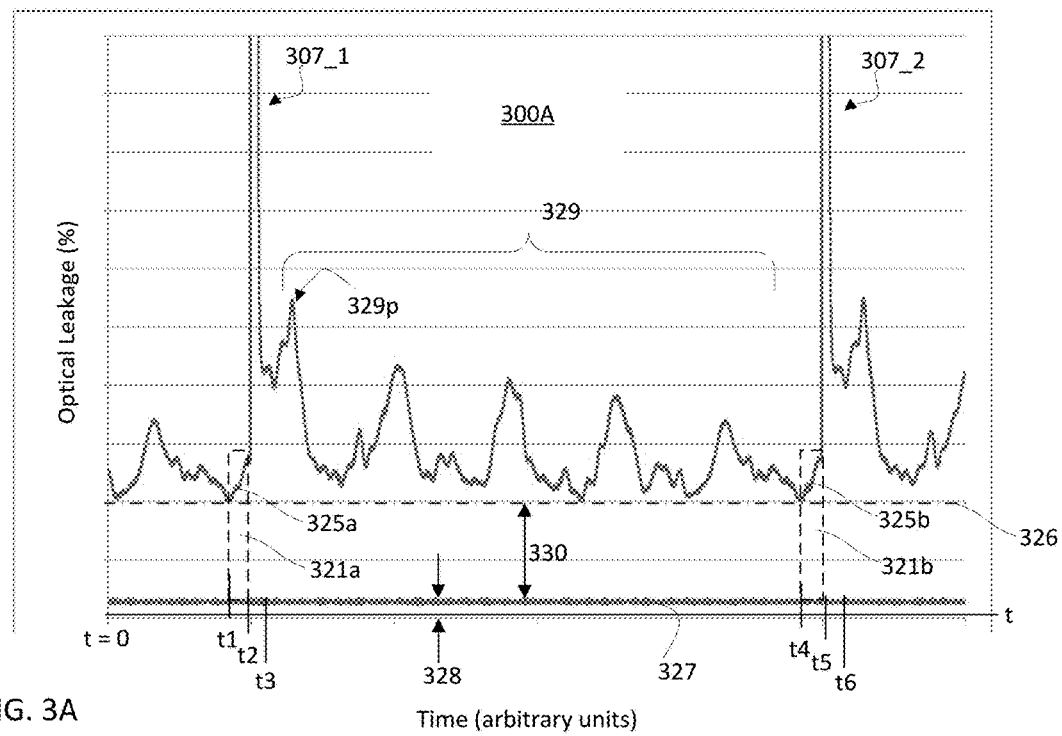
FIG. 3A is a plot of optical leakage of the modulation module of FIG. 2A and two pulses formed by the modulator of FIG. 2A.
Figure 3B:
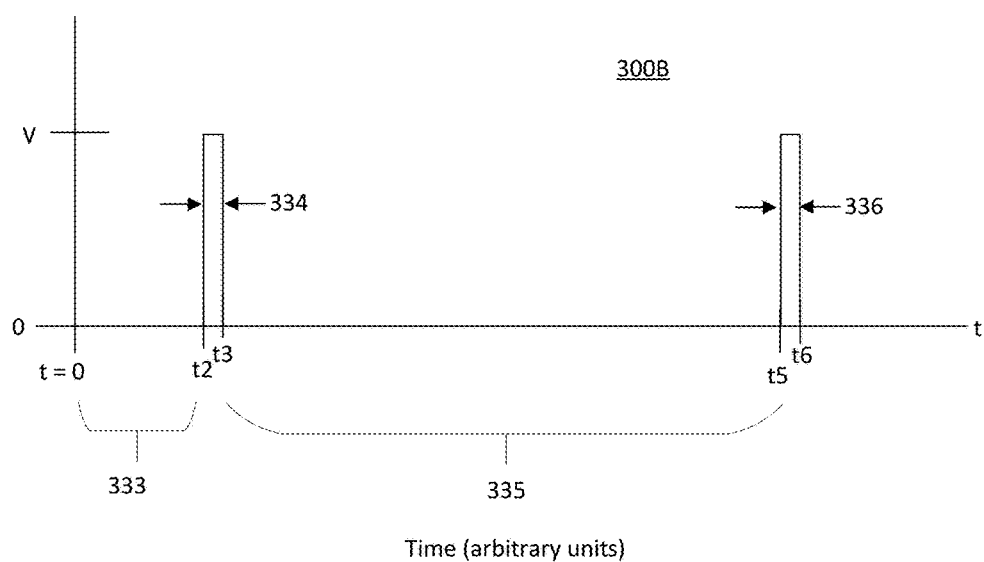
FIG. 3B is an example of a timing diagram to apply to a modulation module to produce pulses shown in FIG. 3A.

FIG. 3A shows plots of optical leakage of an optical modulator as a function of time without the benefit of irradiation by the seed light beam 114. The example shown in FIG. 3A is discussed with respect to the modulation module 120 and the semiconductor 122. Pulses 307_1 and 307_2 (FIG. 3A) are produced by applying a potential difference to the semiconductor 122 of the modulation module 120 (FIG. 3B). The optical leakage is the percentage of light incident on the modulation module 120 that passes through the modulation module 120 even when the potential difference is not applied to the semiconductor 122.

In the example of FIG. 3A, a continuous wave light beam is incident on the semiconductor 122. Referring also to FIG. 3B, a timing diagram 300B is shown. The timing diagram 300B is an example of voltages applied to the semiconductor 122 during the time period illustrated in FIG. 3A. When the potential difference V is applied to the semiconductor 122, and the polarization of the light emerging from the semiconductor 122 is matched to the polarization-based optical element 124, a relatively high percentage of incident light passes through the modulation module 120. Pulses 307_1 and 307_2 are formed from light that passes through the modulation module 120 while the potential difference V is applied to the semiconductor 122.

The timing diagram 300B shows four periods 333-336. The period 333 includes time (t=0) to time (t=t2). The potential difference V is not applied to the semiconductor 122 during the period 333. The period 334 begins at time (t=t2) and ends at time (t=t3). The potential difference V is applied to the semiconductor 122 during the period 334 to form the pulse 307_1. The period 335 begins at time (t=t3) and ends at time (t=t5). The potential difference V is not applied to the semiconductor 122 during the period 335. The potential difference V is again applied to the semiconductor 122 during the period 336 (which begins at t=t5 and ends at t=t6) to form the pulse 307_2.

The temporal duration of the periods 333-336 depends on the characteristics of the modulation module 120 and the operating parameters of the EUV light source 101. For example, the rise time of the modulation module 120 (the time for the semiconductor 122 to respond to an applied potential difference) may determine the minimum duration of the periods 334 and 336. The desired temporal duration of the pulses 307_1 and 307_2 also may determine the duration of the periods 334 and 336. In some implementations, the periods 334 and 336 may be, for example, 50-300 nanoseconds (ns), 50-1000 ns, or 50-100 ns. The period 335 may be, for example, 20,000 ns. The example of FIG. 3A shows two pulses 307_1 and 307_2. However, additional pulses may be formed by applying the potential difference V again at a later time. For example, pulses may be produced at 50 kHz by applying the potential difference V to the semiconductor 122 every 20,000 ns.

In addition to the pulses 307_1 and 307_2, spurious light (for example, optical leakage) emerges from the modulation module 120 at other times due to defects in the semiconductor 122 and other effects. The optical leakage has several components, all of which are types of optical leakage: static leakage 328, acoustic leakage 329, and dynamic leakage offset (DLO) 330. The static optical leakage 328 is present regardless of whether the potential difference V is applied or not. The acoustic leakage 329 and the DLO 330 arise due to the application of the potential difference V. Together, the acoustic leakage 329 and the DLO 330 may be considered dynamic optical leakage.

The static optical leakage 328 is the percentage of incident light that passes through the modulation module 120 regardless of whether the potential difference V is applied to the semiconductor 122. In the example of FIG. 3B, a trace 327 shows the static optical leakage 328 as a function of time.

The dynamic optical leakage also includes the acoustic leakage 329. Applying the potential difference V affects the piezo-electric properties of the semiconductor 122 and generates acoustic waves that propagate in the semiconductor 122. The acoustic waves persist after the potential difference V is removed. The presence of the acoustic waves in the semiconductor 122 changes the index of refraction of the semiconductor 122 and thus may result in unintentional transmission of light through the modulation module 120 during the time period 335. The portion or percentage of incident light that is emitted as acoustic leakage 329 oscillates over time between a minimum acoustic leakage 326 and a peak acoustic leakage 329p. The acoustic leakage 329 is also damped over the time period 335 (the amount of acoustic leakage decreases from the peak 329p with each subsequent oscillation that occurs in the period 335). The characteristics of the dampening depend on the properties of the semiconductor, and the oscillations may not fully dampen before the next application of the potential difference V. For example, the oscillations may not fully dampen until about 100 µs after the application of the potential difference V, and the time period 335 may be, for example, about 20 µs. Thus, the oscillations may still be present in the semiconductor 122 when the potential difference V is applied again.

The dynamic optical leakage also includes the DLO 330. The DLO 330 is thought to be caused primarily by the presence of charges (for example, electrons) trapped in defects in the semiconductor 122. The trapped charges create an electric field within the semiconductor 122 and prevent the applied potential difference V from being uniform throughout the semiconductor 122.

Thus, although the potential difference V is applied to the semiconductor during the time periods 334 and 336 to form the respective pulses 307_1 and 307_2, the presence of the optical leakage results in the pulses 307_1 and 307_2 including light that arises from spurious sources. For example, the pulses 307_1 and 307_2 include a respective pedestal portion 325a, 325b. The pedestal portions 325a, 325b occur before the remaining portions of the respective pulse 307_1, 307_2. In the example of FIG. 3A, the pedestal portions 325a, 325b are shown as a percentage of transmission of the average total optical leakage within a 400 nanosecond (ns) window. The windows are labeled as 321a and 321b. The window 321a is from time=t1 to time=t2, and the window 321b is from time=t4 to time=t5. The pedestal portions 325a, 325b occur when the potential difference V is not applied to the semiconductor 122.

In the example of FIG. 3A, the DLO 330 is the largest component of the total optical leakage, and a large portion of the pedestal portion 325a, 325b may be removed by reducing or eliminating the DLO 330. For example, the DLO 330 may account for between 33% and 66% of the total optical leakage. In one example, the total optical leakage is 0.3%, the static leakage 328 is 0.07%, the acoustic leakage 329 is 0.07%, and the DLO 330 accounts for 0.16%. However, other examples may have different parameters. For example, CZT (which may be used as the semiconductor 122) may have a DLO of 2%. In another example, optical leakage in a modulation module that uses CdTe as the semiconductor 122 may have a relatively low DLO component and a more dominant acoustic component. In these implementations, the reduction of the acoustic component of the optical leakage has a larger impact on the reduction or elimination of the pedestal portion. As discussed with respect to FIGS. 4A and 4B, the DLO 330 and the acoustic leakage 329 is reduced by illuminating the semiconductor 122 with the seed light beam 114.

Figure 4A:
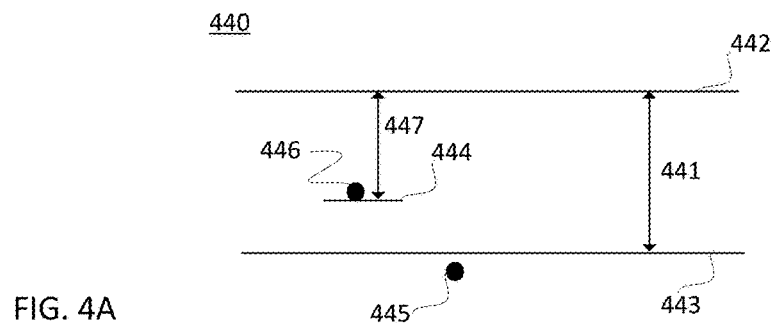
FIG. 4A is an example of an energy diagram for a semiconductor of the modulation module of FIG. 2A.

Referring to FIG. 4A, an illustration of an electronic band structure 440 (energy versus carrier momentum) of the semiconductor 122 is shown. The electronic band structure 440 describes the range of energies that an electron in the semiconductor 122 may have. The semiconductor 122 has a band gap energy (Eg) 441, which is the energy difference (in electron volts or eV) between a conduction band 442 and a valence band 443. An electron (for example, the electron 445) may migrate from the valence band 443 to the conduction band 442 if the electron gains enough energy to move to the conduction band 442. The electron may gain energy by absorbing either a phonon (heat) or a photon (light). Electrons in the conduction band 442 flow as electrical current.

The semiconductor 122 includes defects, such as, for example, precipitates, inclusions, twins, and/or slip-planes. The defects act as sites where charges (for example, an electron 446) become trapped. In the example of FIG. 4A, a deep-level trap 444 is formed from a defect. The deep-level trap 444 is associated with a trap gap energy 447, which is the energy difference between the deep-level trap 444 and the conduction band 442. The trap gap energy 447 is less than the band gap energy 441.

Figure 4B:
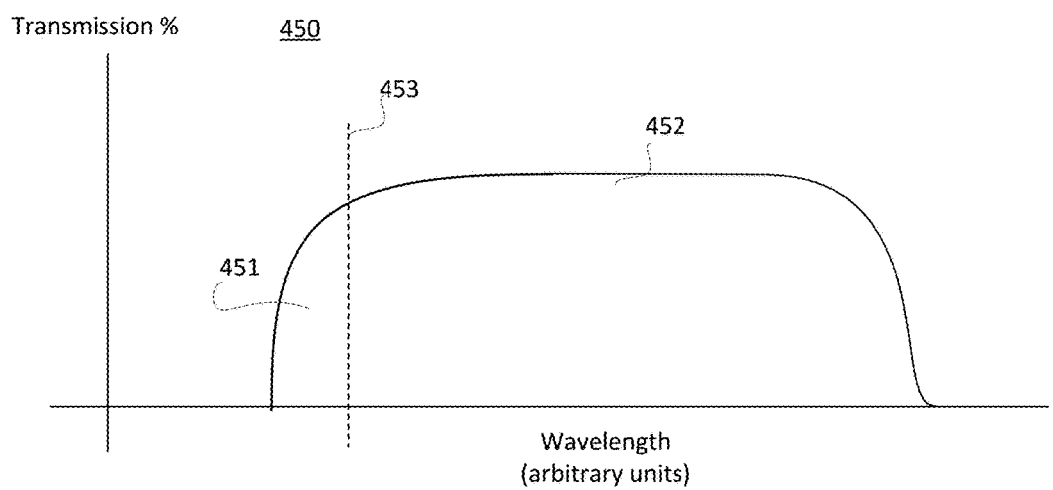
FIG. 4B is an example of a spectral transmission characteristic for a semiconductor of the modulation module of FIG. 2A.

Referring also to FIG. 4B, a spectral transmission characteristic 450 for the semiconductor 122 is shown. The spectral transmission characteristic 450 represents the percentage transmission as a function of wavelength of incident light. In the spectral transmission characteristic 450, the lowest wavelength (or the shortest wavelength) is on the leftmost side of the horizontal axis, with the wavelength increasing (or becoming longer) as the x axis increases to the right.

The spectral transmission characteristic 450 includes a transmission region 452, an electronic absorption region 451, and an absorption edge 453. The absorption edge 453 is the interface or boundary between the transmission region 452 and the electronic absorption region 451. The wavelength of the absorption edge 453 has a photon energy that corresponds to the band gap energy 441. A photon having a wavelength (λ) has a photon energy (E) provided by Equation 1:

$$E = \frac{hc}{\lambda}, \qquad \text{Equation 1}$$

where h is the Planck constant and c is the speed of light.

The semiconductor 122 may be CdZnTe. In this example, the transmission region 452 is between about 0.8 microns (µm) and 20 (µm), and the absorption edge is about 730 nanometers (nm). For light having a wavelength in the transmission region, about 60% of incident light is transmitted. In another example, the semiconductor 122 is CdTe. In this example, the transmission region 452 is between about 0.9 µm to 20 µm, and the absorption edge is about 861 nm. For light having a wavelength in the transmission region, about 65% of incident light is transmitted. Light having a wavelength in the electronic absorption region 451 has a photon energy greater than the band gap energy 441. Such photons are likely to be absorbed by the semiconductor 122.

The light beam 106, which is used to form the pulse 107, has a wavelength in the transmission region 452 and is thus transmitted through the semiconductor 122. The light beam 114, which is used to illuminate the semiconductor 122, may have a broad spectrum and may include many wavelengths (and thus many different photon energies), including wavelengths that have a photon energy that is less than the band gap energy 441. Light having wavelengths that are greater than the absorption edge 453 (or having a photon energy that is less than the band gap energy 441) travel in the semiconductor 122 and may excite charges trapped in the deep-level traps formed by defects, such as the electron 446 in the trap 444 of FIG. 4A. The photons in the light beam 114 transfer energy to the trapped charges, and the transferred energy may be sufficient to migrate trapped charges into the conduction band 442, where the charges flow as current. For example, these photons may increase the thermal energy of the trapped charges such that the charges are able to migrate to the conduction band 442. Additionally or alternatively, such photons may provide energy to charges that have accumulated in the valence band 443 to migrate these charges to the trap 444. Other photons from the beam 114 may further excite these charges to cause the charges to migrate from the trap 444 to the conduction band 442 to flow as electrical current.

Thus, illuminating the semiconductor 122 with the light beam 114 releases trapped charges (such as the electron 446 of FIG. 4A) and excites these charges to the conduction band 442. Illuminating the semiconductor 122 with the light beam 114 also may increase the amount of charge in the valence band 443 that migrates to the conduction band 442. Once in the conduction band 442, the charges flow as electrical current, thereby increasing the conductivity and decreasing the resistivity of the semiconductor 122. When the conductivity is increased, the DLO 330 decreases. Moreover, removing or reducing the trapped charges results in a more uniform electric field within the semiconductor 122 when the potential difference V is applied. Further, illuminating the semiconductor 122 with the seed light beam 114 also may reduce the acoustic leakage 329 and also may modify the nature of the acoustic effect in the semiconductor 122. For example, one or more of the frequency and amplitude of the acoustic effect (or acoustic leakage) may change. As such, by illuminating the semiconductor 122 with the seed light beam 114, the optical leakage is reduced and the amount of light in the pedestal portions 325a, 325b is reduced.

Figure 5A:
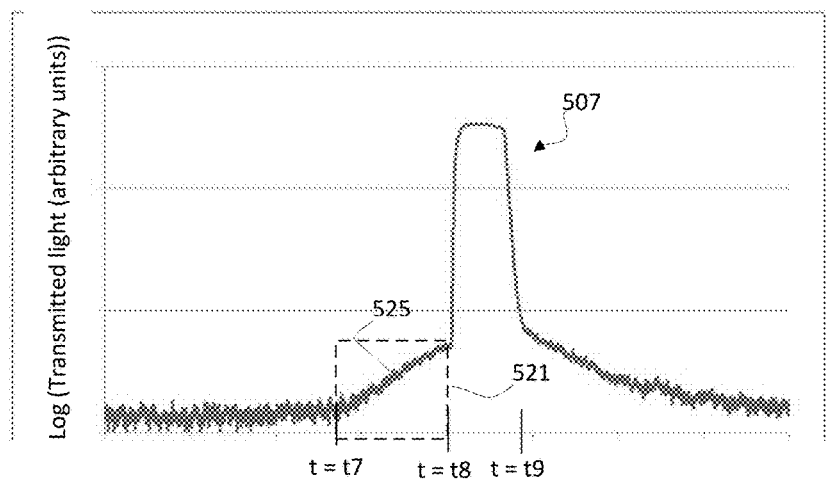
FIG. 5A is a plot of two optical pulses that may be produced by the modulation module of FIG. 2A.
Figure 5B:
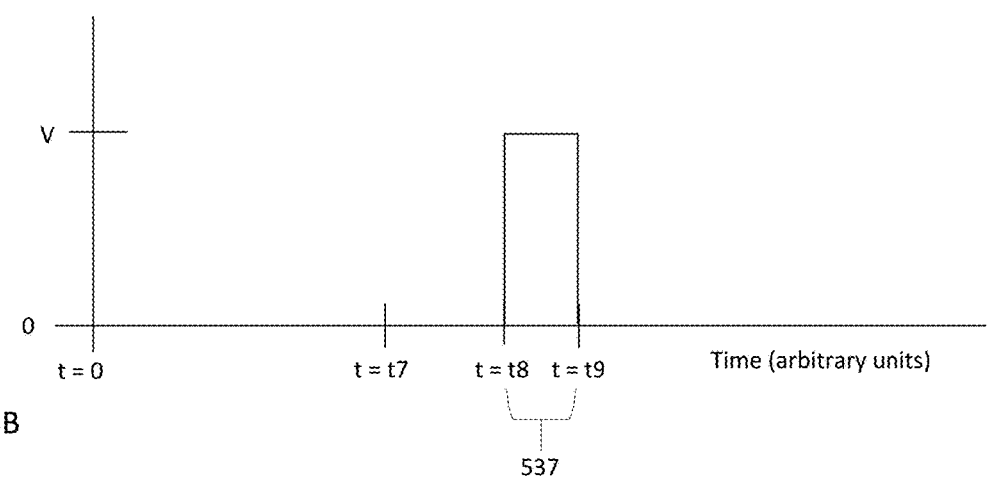
FIG. 5B is an example of a timing diagram to apply to a modulation module to produce pulses shown in FIG. 5A.

FIGS. 3A and 3B show an example in which the light beam 106 is a continuous wave light beam. However, in some implementations, the light beam 106 is a pulsed light beam that includes a train of pulses of light separated in time, and synchronous to the voltage potential V applied across the crystal. The modulation module 120 also may be used to form optical pulses from any of the pulses in the pulsed light beam. FIGS. 5A and 5B relate to an optical pulse 507 formed from a pulse of light.

In implementations in which the light beam 106 is a pulsed light beam, the control system 175 (FIGS. 1 and 2A) may provide a trigger to the light source 105 such that a pulse of light is emitted while the potential difference is applied to the semiconductor 122. For example, the light source 105 may be a Q-switched $CO_2$ laser that is controlled to emit a pulse by receiving a trigger from the control system 175. In some implementations, the light source 105 emits pulses on a periodic basis without receiving a trigger from the control system 175.

FIG. 5A is a plot of light transmitted by the optical modulator 120 as a function of time. The vertical axis of FIG. 5A is a logarithmic scale. FIG. 5B is a plot that shows voltage applied to the semiconductor 122 during the time shown in FIG. 5A. The optical pulse 507 is formed by applying the potential difference V to the semiconductor 122 while all or a portion of the pulse of the light beam 106 propagates in the semiconductor 122. Applying the potential difference to the semiconductor 122 while the pulse propagates in the semiconductor 122 allows the polarization of the pulse to be changed such that the polarization-based optical element 124 (FIG. 2A) directs the light that emerges from the semiconductor 122 onto the beam path 111 (FIG. 2A).

In the example of FIGS. 5A and 5B, the potential difference V is applied to the semiconductor 122 during a period 537 that begins at time t=t8 and ends at time t=t9. The potential difference V is not applied at the other times shown on FIG. 5B. When the potential difference V is applied at time t=t8, the index of refraction of the semiconductor 122 changes instantaneously, such that the polarization of light passing through the semiconductor 122 matches the polarization-based optical element 124 and exits the optical modulator 120. Between the times t7 and t8, light from the pulse of the light beam 106 passes through the modulation module 120 due to optical leakage, forming a pedestal portion 525. The optical leakage may include DLO 330 and/or acoustic leakage 329 caused by an acoustic wave that formed in the semiconductor during a prior application of the potential difference V. By illuminating the semiconductor 122 with the seed light beam 114, the maximum amount of light or the average amount of light in the pedestal 525 may be changed, reduced, or eliminated. In the example of FIG. 5A, a window 521 shows the portion of the pulse 507 that is the pedestal 525.

Figure 6:
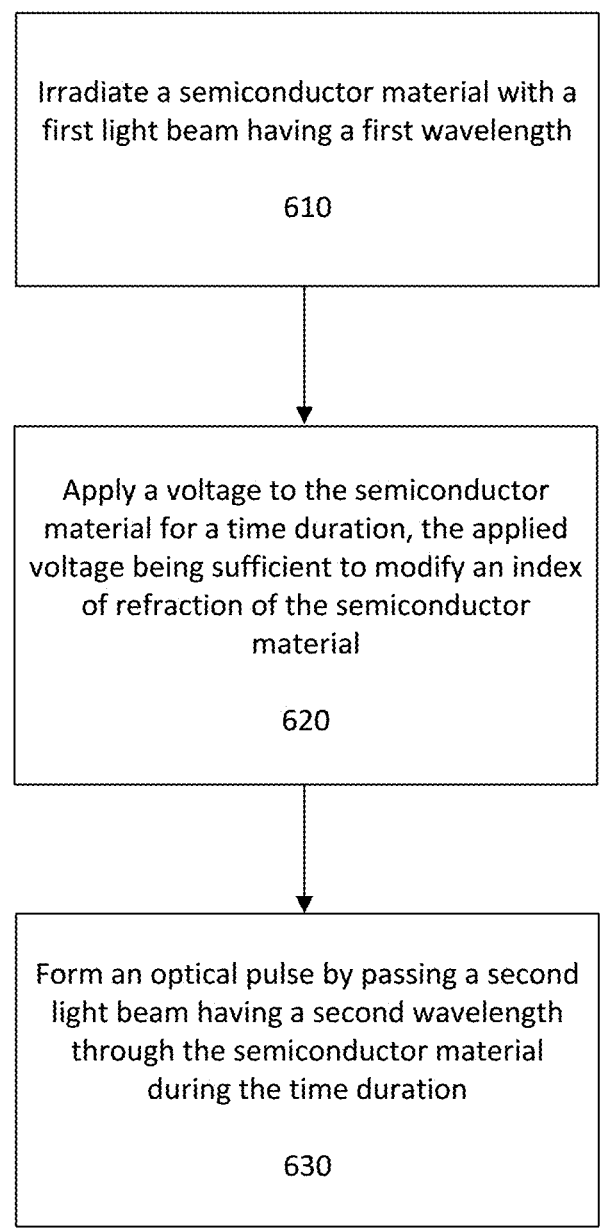
FIG. 6 is a flow chart of an example of a process of forming an optical pulse.

Referring to FIG. 6, a flow chart for a process 600 is shown. The process 600 is an example of a process for producing an optical pulse, such as the optical pulse 107 (FIGS. 1 and 2B), for use in the EUV light source 101 of FIG. 1 or any other EUV light source. The process 600 may be used to control or modify one or more characteristics of a pedestal portion of an optical pulse. For example, the process 600 may be used to reduce an average or maximum intensity of the pedestal portion of the produced optical pulse. The process 600 is discussed with respect to the EUV light source 101 of FIG. 1 and the modulation module 120 (FIGS. 1 and 2A).

The semiconductor 122 of the modulation module 120 is illuminated with a first light beam having a first wavelength (610). The first light beam may be the seed light beam 114. The first wavelength is any wavelength that is capable of liberating electrical charges trapped in the semiconductor 122. Defects in the semiconductor 122 may act as sites where electrical charges are trapped, such as the deep-level trap 444 (FIG. 4A). The trapped charges result in a lower conductivity and higher resistivity compared to an ideal version of the semiconductor 122 that lacks defects and trapped charges. The traps formed by the defects have band gap energies that are less than the band gap energy 441 of the semiconductor 122. Thus, trapped charges may be liberated from the defect traps by exciting the charges with light having a wavelength associated with a photon energy that is less than the band gap energy 441.

For example, the semiconductor 122 may be CZT, which has a band gap energy corresponding to a wavelength of 730 nm, or CdTe, which has a band gap energy corresponding to a wavelength of 861 nm. In these examples, the seed light source 110 may be any light source that produces near-infrared (NIR) light that includes light of a wavelength with a photon energy less than the band gap energy of the semiconductor 122. NIR light includes wavelengths between 750 nm and 3.5 microns (µm). For example, a diode laser that has a peak wavelength of 905.7 nm and a full-width at half max (FWHM) of 1 nm or a light emitting diode that has a peak wavelength of 873 nm and a FWHM of 70 nm may be used as the seed light source 110. In another example, the seed light beam 114 may include one or more wavelengths between 838 nm and 988 nm. The first wavelength may be associated with a photon energy that is greater than the trap gap energy 447. As discussed above, the trap gap energy 447 is less than the band gap energy 441.

A voltage is applied to the semiconductor 122 for a time duration (620). An optical pulse (such as the optical pulse 107) is formed by passing a second light beam having a second wavelength through the semiconductor during the time duration (630). The second light beam may be, for example, the light beam 106 of FIG. 1. The light beam 106 may be continuous wave or a beam that includes one or more pulses of light.

The second light beam includes at least one wavelength that has a photon energy far below the band gap 441 of the semiconductor 122. Thus, the second light beam is transmitted through the semiconductor and is used to form the pulse 107. The light beam 106 includes one or more wavelengths that are different from the first wavelength. The light beam 106 may include a wavelength that is no more than 3.5 times greater (longer) than the peak wavelength of the first light beam. In some implementations, the light beam 106 includes a wavelength that is no more than ten times greater (longer) than the peak wavelength of the seed light beam 114. Continuing the above example, the semiconductor 122 may be CZT, which has a band gap of 730 nm, or CdTe, which has a band gap of 861 nm. In these examples, the second light beam may be produced by a $CO_2$ laser and may include one or more wavelengths between 8 μm and 15 μm or one or more wavelengths between 9 μm and 11 μm. The light beam 106 and the light beam 114 may propagate in the semiconductor 122 at the same time. Additionally, the light beam 106 and the light beam 114 may follow the same path through the semiconductor 122. It may be possible for the effects of irradiating the semiconductor 122 with the seed light beam 114 to persist after the seed light beam 114 is no longer illuminating the semiconductor 122. For example, the electrical properties (such as the leakage current and resistivity) may become more stable (with less variation in time) after illumination with the seed light beam 114.

Illuminating the semiconductor 122 with the seed light beam 114 liberates trapped charges in the semiconductor 122, increasing the conductivity of the semiconductor 122 and decreasing the optical leakage of the modulation module 120. The decrease in optical leakage also decreases the amount of light in the pedestal portion of the pulse 107. FIGS. 7-10 show experimental results obtained by illuminating the semiconductor 122 with the seed light beam 114.

Figure 7:
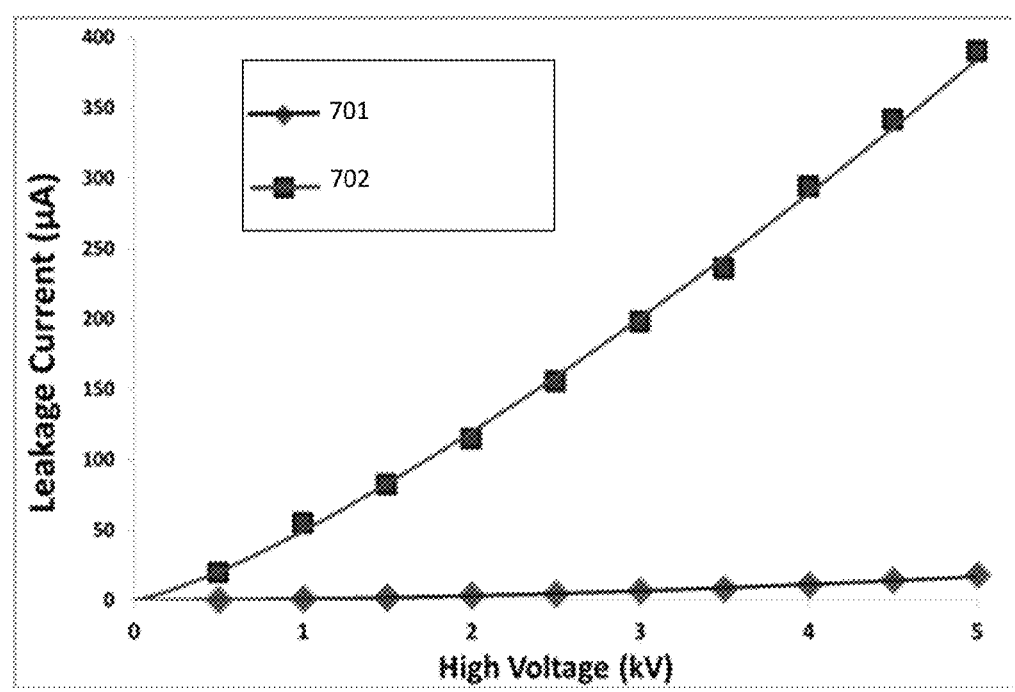
FIGS. 7-10 are examples of experimental results.

FIG. 7 includes current-voltage (I-V) plots 701 and 702 that show measured current (microAmps) versus voltage (kiloVolts) applied to the semiconductor 122 without irradiation by the seed light beam 114 (I-V plot 701) and with irradiation by the seed light beam 114 (I-V plot 702). In the example of FIG. 7, CZT was used as the semiconductor 122. The applied voltage was varied with a direct current (DC) power supply from 0 V to 5000 V (5 kV). A 2 megaohm (MΩ) sampling resistor was connected to the semiconductor 122, and the leakage current was measured with a high-voltage probe across the 2 MΩ resistor. The leakage current was measured first without illuminating the semiconductor 122, and these measured currents are included in the plot 701. A NIR source was used as the seed light source 110. The leakage current was measured while the semiconductor 122 was being illuminated with the seed light beam 114, and these measured leakage currents are included in the plot 702.

As seen in FIG. 7, illuminating the semiconductor 122 with the seed light beam 114 increased the leakage current at all applied voltages greater than zero. The increased leakage current indicates that trapped charges were liberated due to the irradiation by the seed light beam 114. This increase in leakage current due to illumination with the seed laser beam can also be seen as an increase in the photoconductivity of the semiconductor.

Figure 8:
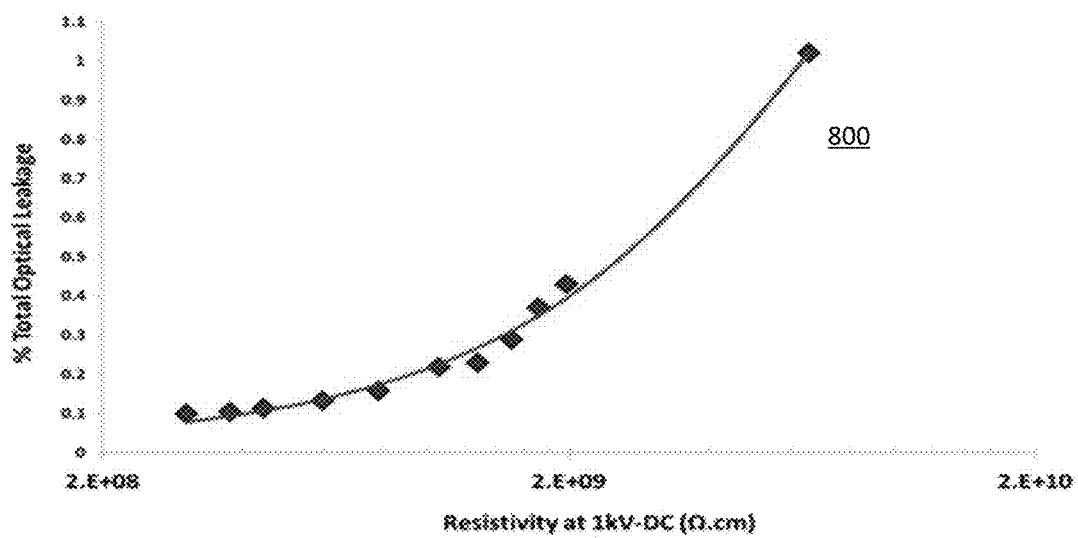

FIG. 8 includes a plot 800 of total optical leakage (%) as a function of resistivity (at 1 kV-DC in Ohm centimeters) of the semiconductor 122. In the plot 800, the semiconductor 122 was CZT. The seed light beam 114 illuminated the semiconductor 122 while the data was collected. The seed light beam 114 was a NIR beam and the intensity of the beam was increased during the data collection from zero to a maximum of 1 microWatt (μW) coupled into the semiconductor. As shown, the total optical leakage decreases as the resistivity of the semiconductor 122 decreases and the intensity of the seed light beam 114 increases. Resistivity is inversely proportional to conductivity, thus, the plot 800 indicates that the optical leakage decreases with increased conductivity and increased intensity of the seed light beam 114. The increased conductivity corresponds to liberation of trapped charges through excitation with the seed light beam 114. The plot 800 also indicates that different optical leakages may be obtained by varying the intensity of the seed light beam 114. As such, in addition to reducing the amount of optical leakage by varying the intensity of the seed light beam 114, the amount of optical leakage (and thus control the amount of light in the pedestal of the pulse 107) may be controlled or varied.

Figure 9:
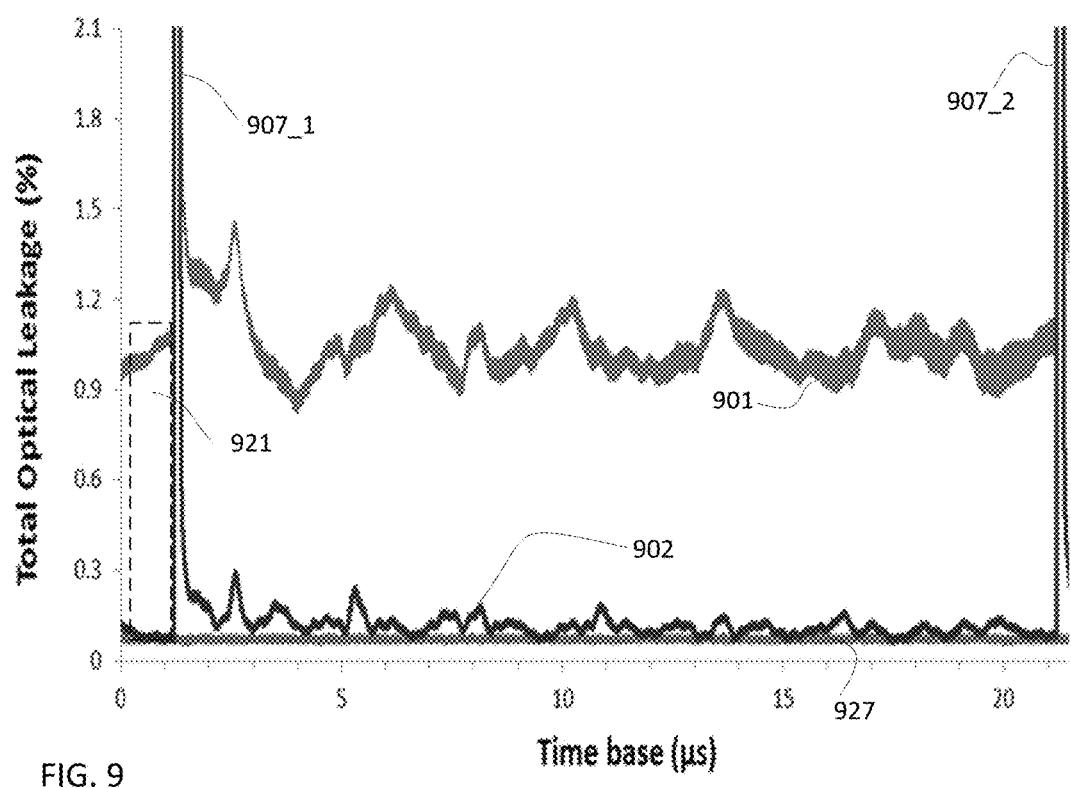

FIG. 9 shows experimentally measured optical leakage as a function of time. The plot 901 shows the optical leakage when the semiconductor 122 is not illuminated with the seed light beam 114, and the plot 902 shows the optical leakage when the semiconductor 122 is illuminated with the seed light beam 114. In the example of FIG. 9, the light beam 106 was a continuous wave light beam generated by a $CO_2$ laser. The seed light beam 114 was a continuous wave NIR light beam. The pulses 907_1 and 907_2 were formed using the modulation module 120.

As shown by comparing the plot 901 and the plot 902 of FIG. 9, illuminating the semiconductor 122 with the seed light beam 114 reduces the optical leakage. The maximum optical leakage within a pedestal region 921 is reduced from about 1.1% (without the seed light beam 114) to about 0.05% (with the seed light beam) in this particular example. Additionally, the optical leakage that occurs between the pulses 907_1 and 907_2 (including components of the leakage attributable to the acoustic leakage) is also reduced from a maximum of about 1.4% (without the seed light beam 114) to a maximum of about 0.3% (with the seed light beam 114). Considering the acoustic leakage alone without the DLO, the highest peak-to-valley was about 0.6% without illumination and is about 0.2% with illumination. Thus, in this example, there was about a three-fold reduction in the acoustic leakage due to illuminating the semiconductor 122 with the seed light beam. In other examples, additional reduction of the acoustic leakage (for example, a six-fold reduction) may be achieved. Illuminating the semiconductor 122 with the seed light beam 114 does not eliminate or substantially change the static leakage, which is shown as a trace 927 in FIG. 9.

Figure 10:
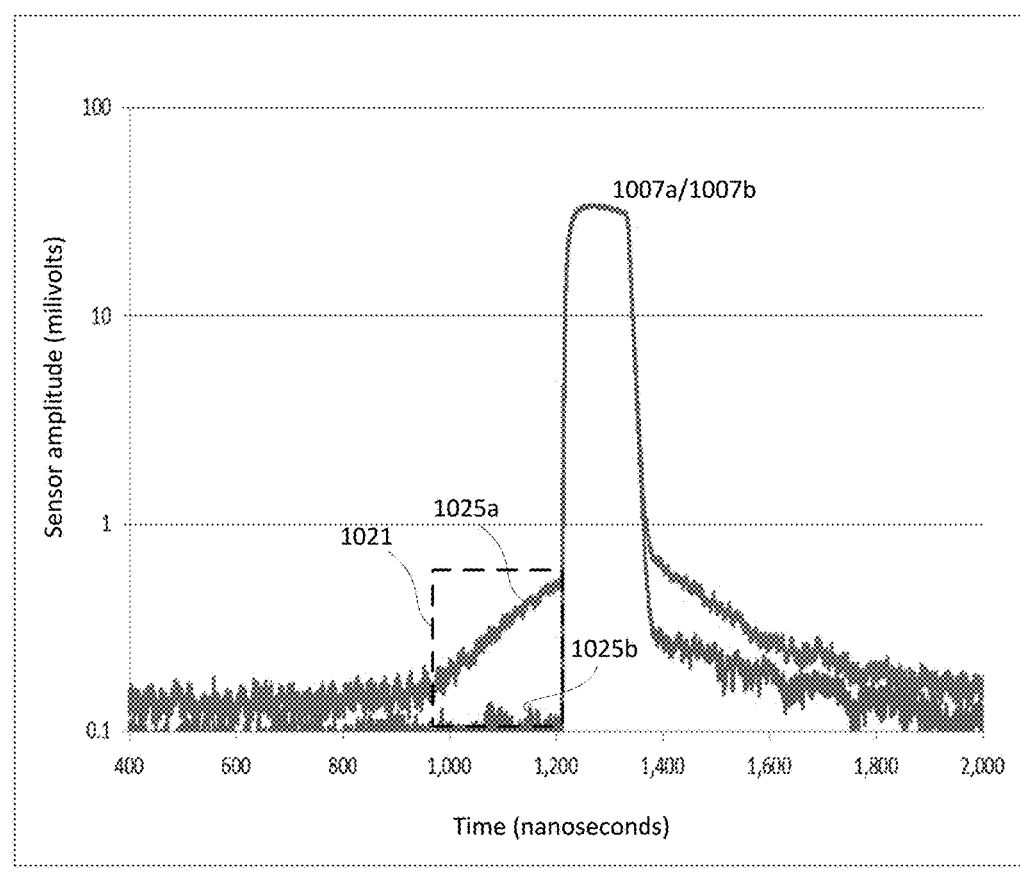

FIG. 10 shows pulses 1007_a and 1007_b as measured sensor voltage versus time. The pulse 1007_a was formed with the optical modulator 120 without illuminating the semiconductor 122 with the seed light beam 114. The pulse 1007_b was formed with the optical modulator 120 while the semiconductor 122 was illuminated with the seed light beam 114. In the example of FIG. 10, the light beam 106 was a pulsed light beam produced by a $CO_2$ laser. The pulses 1007_a and 1007b were each formed from a separate pulse in the pulsed light beam, but are shown on the same time scale for comparison purposes. The light passing through the modulation module 120 was measured with a sensor that produces voltage in response to detecting light. The voltage produced by the sensor was measured over time and used to produce the plots shown in FIG. 10.

The pulses 1007_a and 1007_b have respective pedestal portions 1025a, 1025b that occur over a time window 1021. The maximum voltage measured by the sensor for the pedestal 1025a was about 0.8 millivolts (mV) in this example. The maximum voltage measured by the sensor for the pedestal 1025b was less than 0.1 mV. Thus, illuminating the semiconductor 122 with the seed light beam 114 reduced the amount of light in the pedestal. The maximum voltage measured by the sensor for a pedestal portion of pulse produced while the semiconductor 122 was being illuminated may be 10-20 times lower compared to a pedestal portion of a pulse produced while the semiconductor 122 was not being illuminated with the seed light beam. For example, for the first 1-2 hours of use of a system that uses the modulation module 120, the semiconductor 122 is heated from an initial unheated state by the light beam 106 and the application of the potential difference V. The reduction in the pedestal portion may be about 20 times when the semiconductor 122 is in the unheated state. As the semiconductor 122 warms from the light beam 106 and the application of the potential difference V, the reduction in the pedestal portion may be around 10 times.

The data shown in FIGS. 8-10 were measured with the same voltage sensor, a PEM sensor available from Boston Electronics, however, the data was normalized to the peak intensity of the produced pulse.

Figure 11:
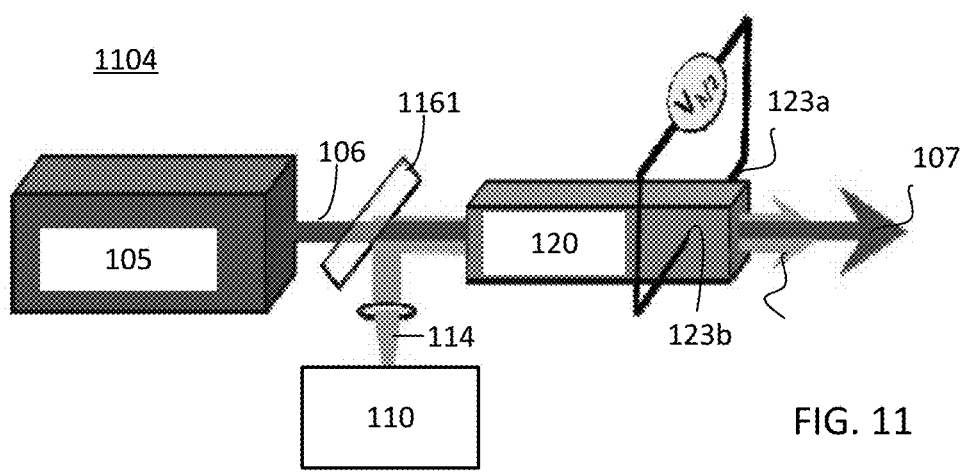
FIGS. 11 and 12 are perspective illustrations of pulse generating systems that may be used in the EUV light source of FIG. 1.
Figure 12:
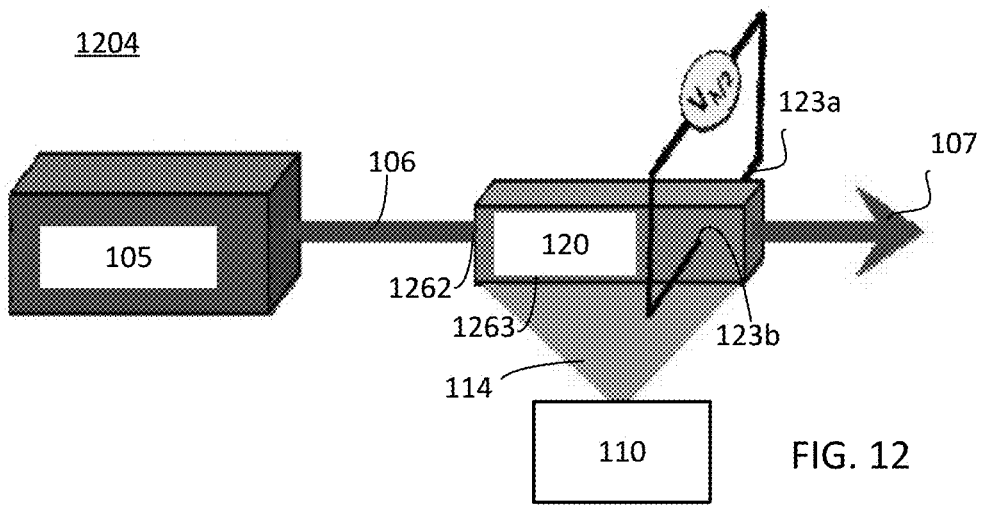

FIGS. 11 and 12 show perspective views of pulse generating systems 1104 (FIG. 11) and 1204 (FIG. 12). The pulse generating systems 1104 and 1204 are examples of implementations of the pulse generating system 104 and may be used in the EUV light source 101 (FIG. 1).

In the pulse generating system 1104, the light beam 106 and the seed light beam 114 are combined by a dichroic optical element 1161. The dichroic optical element 1161 may be any optical element capable of interacting with light based on the wavelength of the light. For example, the dichroic optical element 1161 may be a dichroic mirror that transmits the first wave length (the wavelength of the light beam 106) and reflects the second wavelength (the wavelength of the seed light beam 114).

After interacting with the dichroic optical element 1161, the light beam 106 and the seed light beam 114 interact with the semiconductor 122 (FIGS. 1 and 2A) of the optical modulator 120. The light beam 106 and the seed light beam 114 follow the same path through the semiconductor 122. Additionally, the light beam 106 and the seed light beam 114 may propagate in the semiconductor 122 at the same time. A portion of the light beam 106 is extracted by applying the potential difference V to the semiconductor 122, and the pulse 107 is formed. A portion of the seed light beam 114 also may pass through the optical modulator 120.

In the pulse generating system 1204, the light beam 106 is incident on the semiconductor 122 at a side 1262 and the seed light beam 114 is incident on the semiconductor 122 at a side 1263. The sides 1262 and 1263 are different sides, and the seed light beam 114 and the light beam 106 propagate in different directions in the semiconductor 122. In the implementation of FIG. 12, the seed light beam 114 is diffused or diverged such that the seed light beam 114 illuminates more than one portion of the semiconductor at the same time. The seed light beam 114 may be diffused with a diffuser element (not shown) such as a polytetrafluoroethylene (PTFE) diffuser. The diffuser element is placed between the seed light source 110 and the semiconductor 122.

Figure 13A:
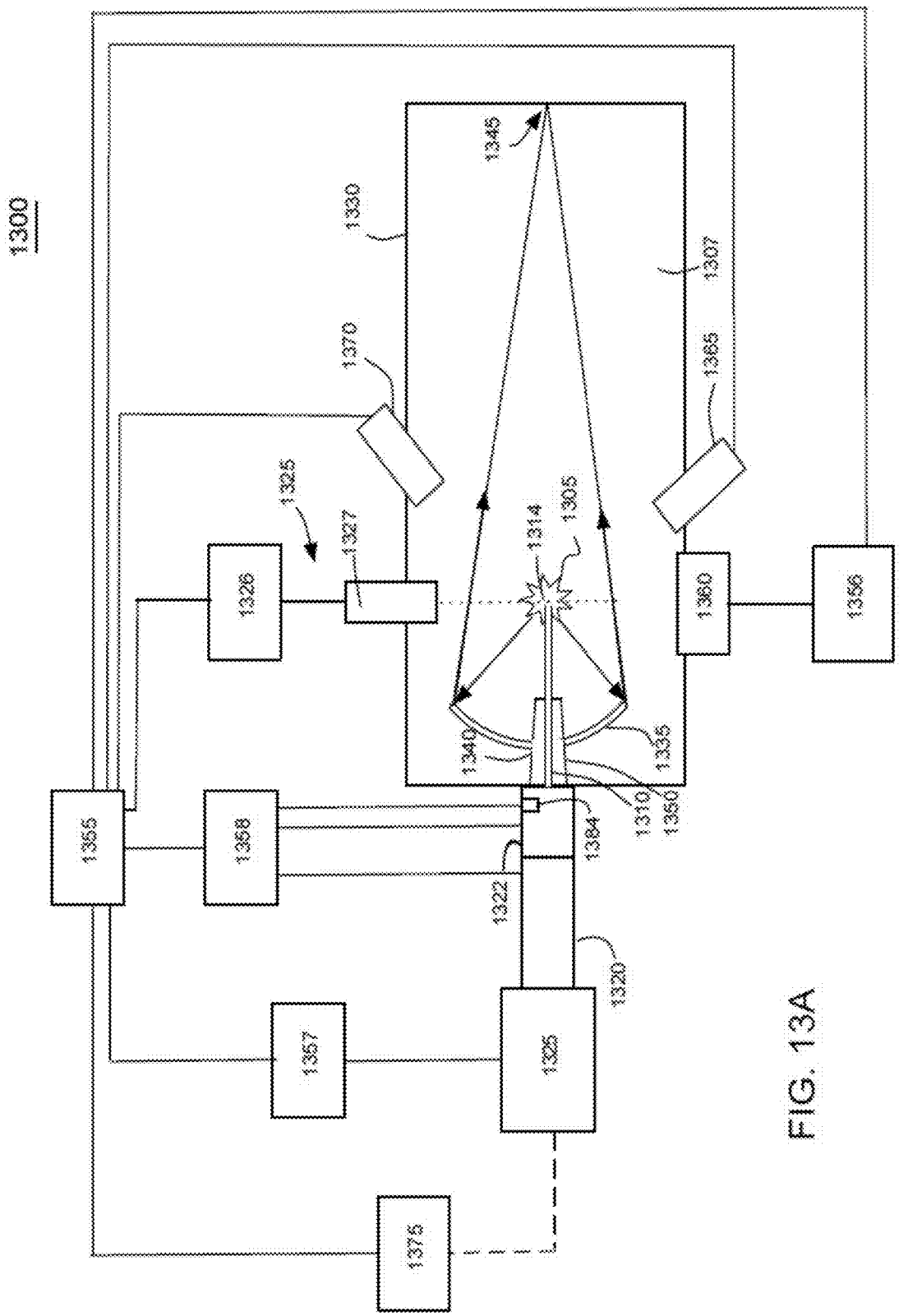
FIGS. 13A and 13B are block diagrams of an example of a EUV light source.

Referring to FIG. 13A, an LPP EUV light source 1300 is shown. The pulse generating systems 104, 1104, and 1204 may be part of an EUV light source, such as the source 1300. The pulse generating systems 104, 1104, and 1204 are not shown in FIG. 13A. However, the pulse generating systems 104, 1104, and 1204 may be positioned in the light source 1300 as part of the beam transport system 1320, for example. In these implementations, the light source 105 of the systems 104, 1104, and 1204 is part of the drive laser system 1315, and the control system 175 may be part of the master controller 1355, any of the components of the master controller 1355, or may be implemented as a separate control system.

The LPP EUV light source 1300 is formed by irradiating a target mixture 1314 at a target region 1305 with an amplified light beam 1310 that travels along a beam path toward the target mixture 1314. The target material of the target 118 may be or include the target mixture 1314. The target region 1305 is within an interior 1307 of a vacuum chamber 1330. When the amplified light beam 1310 strikes the target mixture 1314, a target material within the target mixture 1314 is converted into a plasma state that has an element with an emission line in the EUV range. The created plasma has certain characteristics that depend on the composition of the target material within the target mixture 1314. These characteristics may include the wavelength of the EUV light produced by the plasma and the type and amount of debris released from the plasma.

The light source 1300 also includes a target material delivery system 1325 that delivers, controls, and directs the target mixture 1314 in the form of liquid droplets, a liquid stream, solid particles or clusters, solid particles contained within liquid droplets or solid particles contained within a liquid stream. The target mixture 1314 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 1314 may also include impurities such as non-target particles. Thus, in the situation in which there are no impurities, the target mixture 1314 is made up of only the target material. The target mixture 1314 is delivered by the target material delivery system 1325 into the interior 1307 of the chamber 1330 and to the target region 1305.

The light source 1300 includes a drive laser system 1315 that produces the amplified light beam 1310 due to a population inversion within the gain medium or mediums of the laser system 1315. The light source 1300 includes a beam delivery system between the laser system 1315 and the target region 1305, the beam delivery system including a beam transport system 1320 and a focus assembly 1322. The beam transport system 1320 receives the amplified light beam 1310 from the laser system 1315, and steers and modifies the amplified light beam 1310 as needed and outputs the amplified light beam 1310 to the focus assembly 1322. The focus assembly 1322 receives the amplified light beam 1310 and focuses the beam 1310 to the target region 1305.

In some implementations, the laser system 1315 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 1315 produces an amplified light beam 1310 due to the population inversion in the gain media of the laser amplifiers even if there is no laser cavity. Moreover, the laser system 1315 may produce an amplified light beam 1310 that is a coherent laser beam if there is a laser cavity to provide enough feedback to the laser system 1315. The term "amplified light beam" encompasses one or more of: light from the laser system 1315 that is merely amplified but not necessarily a coherent laser oscillation and light from the laser system 1315 that is amplified and is also a coherent laser oscillation.

The optical amplifiers in the laser system 1315 may include as a gain medium a filling gas that includes $CO_2$ and may amplify light at a wavelength of between about 9100 and about 11000 nm, and in particular, at about 10600 nm, at a gain greater than or equal to 800 times. Suitable amplifiers and lasers for use in the laser system 1315 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The pulse repetition rate may be, for example, 50 kHz. The optical amplifiers in the laser system 1315 may also include a cooling system such as water that may be used when operating the laser system 1315 at higher powers.

Figure 13B:
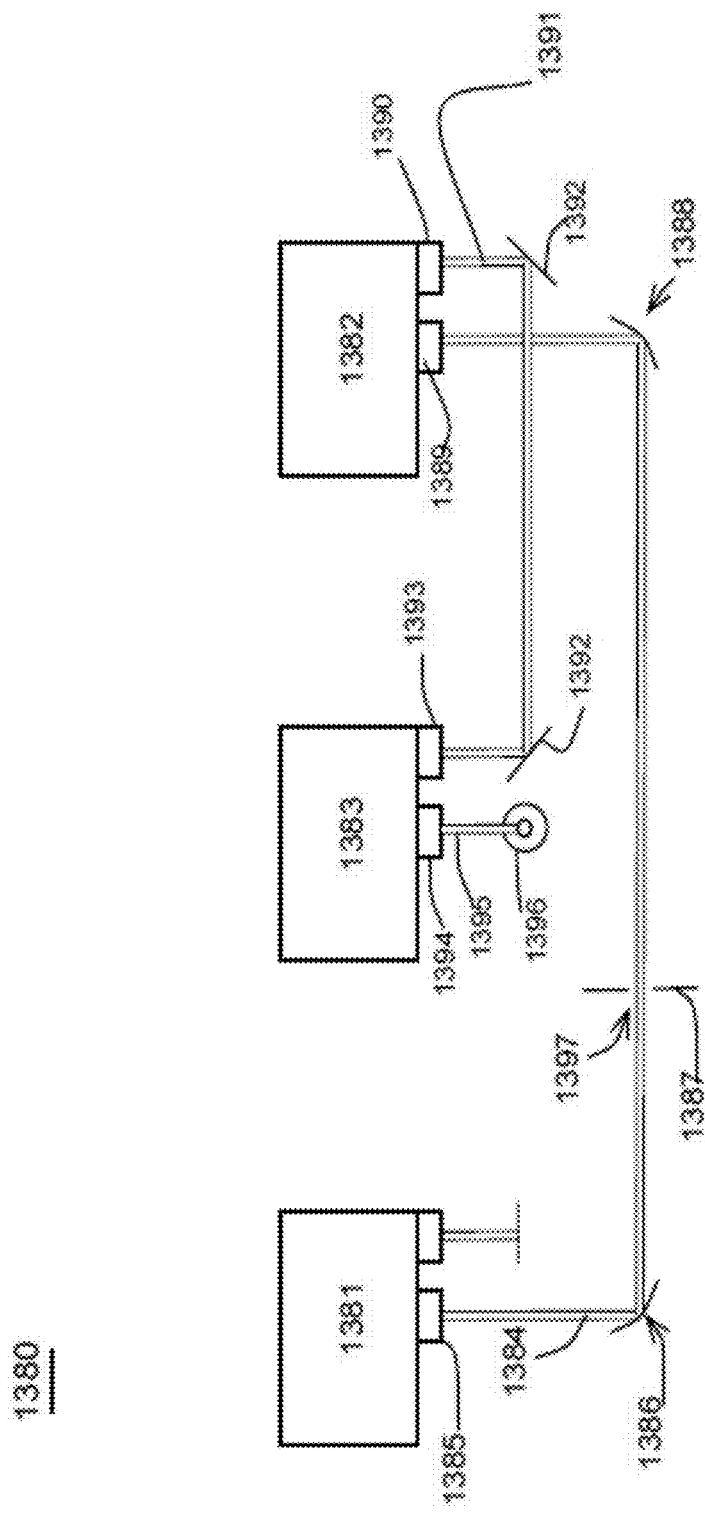

FIG. 13B shows a block diagram of a drive laser system 1380. The drive laser system 1380 may be used as part of the drive laser system 1315 in the source 1300. The drive laser system 1380 includes three (or more) power amplifiers 1381, 1382, and 1383. Any or all of the power amplifiers 1381, 1382, and 1383 may include internal optical elements (not shown).

Light 1384 exits the power amplifier 1381 through an output window 1385 and is reflected off a curved mirror 1386. After reflection, the light 1384 passes through a spatial filter 1387, is reflected off of a curved mirror 1388, and enters the power amplifier 1382 through an input window 1389. The light 1384 is amplified in the power amplifier 1382 and redirected out of the power amplifier 1382 through an output window 1390 as light 1391. The light 1391 is directed toward the amplifier 1383 with a fold mirror 1392 and enters the amplifier 1383 through an input window 1393. The amplifier 1383 amplifies the light 1391 and directs the light 1391 out of the amplifier 1383 through an output window 1394 as an output beam 1395. A fold mirror 1396 directs the output beam 1395 upward (out of the page) and toward the beam transport system 1320 (FIG. 13A).

Referring again to FIG. 13B, the spatial filter 1387 defines an aperture 1397, which may be, for example, a circle having a diameter between about 2.2 mm and 3 mm. The curved mirrors 1386 and 1388 may be, for example, off-axis parabola mirrors with focal lengths of about 1.7 m and 2.3 m, respectively. The spatial filter 1387 may be positioned such that the aperture 1397 coincides with a focal point of the drive laser system 1380.

Referring again to FIG. 13A, the light source 1300 includes a collector mirror 1335 having an aperture 1340 to allow the amplified light beam 1310 to pass through and reach the target region 1305. The collector mirror 1335 may be, for example, an ellipsoidal mirror that has a primary focus at the target region 1305 and a secondary focus at an intermediate location 1345 (also called an intermediate focus) where the EUV light may be output from the light source 1300 and may be input to, for example, an integrated circuit lithography tool (not shown). The light source 1300 may also include an open-ended, hollow conical shroud 1350 (for example, a gas cone) that tapers toward the target region 1305 from the collector mirror 1335 to reduce the amount of plasma-generated debris that enters the focus assembly 1322 and/or the beam transport system 1320 while allowing the amplified light beam 1310 to reach the target region 1305. For this purpose, a gas flow may be provided in the shroud that is directed toward the target region 1305.

The light source 1300 may also include a master controller 1355 that is connected to a droplet position detection feedback system 1356, a laser control system 1357, and a beam control system 1358. The light source 1300 may include one or more target or droplet imagers 1360 that provide an output indicative of the position of a droplet, for example, relative to the target region 1305 and provide this output to the droplet position detection feedback system 1356, which may, for example, compute a droplet position and trajectory from which a droplet position error may be computed either on a droplet by droplet basis or on average. The droplet position detection feedback system 1356 thus provides the droplet position error as an input to the master controller 1355. The master controller 1355 may therefore provide a laser position, direction, and timing correction signal, for example, to the laser control system 1357 that may be used, for example, to control the laser timing circuit and/or to the beam control system 1358 to control an amplified light beam position and shaping of the beam transport system 1320 to change the location and/or focal power of the beam focal spot within the chamber 1330.

The target material delivery system 1325 includes a target material delivery control system 1326 that is operable, in response to a signal from the master controller 1355, for example, to modify the release point of the droplets as released by a target material supply apparatus 1327 to correct for errors in the droplets arriving at the desired target region 1305.

Additionally, the light source 1300 may include light source detectors 1365 and 1370 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 1365 generates a feedback signal for use by the master controller 1355. The feedback signal may be, for example, indicative of the errors in parameters such as the timing and focus of the laser pulses to properly intercept the droplets in the right place and time for effective and efficient EUV light production.

The light source 1300 may also include a guide laser 1375 that may be used to align various sections of the light source 1300 or to assist in steering the amplified light beam 1310 to the target region 1305. In connection with the guide laser 1375, the light source 1300 includes a metrology system 1324 that is placed within the focus assembly 1322 to sample a portion of light from the guide laser 1375 and the amplified light beam 1310. In other implementations, the metrology system 1324 is placed within the beam transport system 1320. The metrology system 1324 may include an optical element that samples or re-directs a subset of the light, such optical element being made out of any material that may withstand the powers of the guide laser beam and the amplified light beam 1310. A beam analysis system is formed from the metrology system 1324 and the master controller 1355 since the master controller 1355 analyzes the sampled light from the guide laser 1375 and uses this information to adjust components within the focus assembly 1322 through the beam control system 1358.

Thus, in summary, the light source 1300 produces an amplified light beam 1310 that is directed along the beam path to irradiate the target mixture 1314 at the target region 1305 to convert the target material within the mixture 1314 into plasma that emits light in the EUV range. The amplified light beam 1310 operates at a particular wavelength (that is also referred to as a drive laser wavelength) that is determined based on the design and properties of the laser system 1315. Additionally, the amplified light beam 1310 may be a laser beam when the target material provides enough feedback back into the laser system 1315 to produce coherent laser light or if the drive laser system 1315 includes suitable optical feedback to form a laser cavity.

Other implementations are within the scope of the claims.

What is claimed is:

1. A method of forming an optical pulse for an extreme ultraviolet (EUV) light source, the method comprising:
   illuminating a semiconductor material of a modulation system with a first light beam having a first wavelength;
   applying a voltage to the semiconductor material for a time duration, the applied voltage being sufficient to modify an index of refraction of the semiconductor material such that a polarization state of a light beam having a second wavelength passing through the semiconductor material is modified to pass through at least one polarization-based optical element of the modulation system;
   forming an optical pulse by passing a second light beam having the second wavelength through the semiconductor material during the time duration, wherein: the formed optical pulse comprises a first portion and a second portion, the first portion and the second portion being temporally contiguous, the first portion occurring before the second portion; and
   adjusting a property of the first light beam to adjust one or more characteristics of the first portion of the formed optical pulse, wherein illuminating the semiconductor material of the modulation system with the first light beam modifies one or more characteristics of the first portion of the formed optical pulse, wherein
   the second portion of the formed optical pulses has an intensity sufficient to convert target material in a target at a target region to a plasma that emits EUV light.

2. The method of claim 1, wherein the one or more modified characteristics of the first portion of the formed optical pulse comprise an average intensity, a maximum intensity, and/or a temporal duration.

3. The method of claim 1, further comprising allowing the formed pulse to propagate toward the target region, the first portion of the formed pulse having a maximum intensity that is less than a maximum intensity of the second portion of the formed pulse.

4. The method of claim 1, wherein:
   the semiconductor material is associated with a spectral transmission characteristic, the spectral transmission characteristic comprising a transmission region and an absorption edge wavelength, the absorption edge wavelength being the lowest wavelength on the transmission region,
   the first wavelength is between the absorption edge wavelength and the second wavelength, and
   the second wavelength is a wavelength in the transmission region.

5. The method of claim 1, wherein the semiconductor material is associated with a band gap energy, the band gap energy being an energy difference between a valence band of the semiconductor material and a conduction band of the semiconductor material, and the photon energy of the first wavelength is less than the band gap energy.

6. The method of claim 5, wherein the semiconductor material comprises defects, the defects creating deep-level traps with energy levels between the valence band and the conduction band, and the photon energy of the first wavelength is equal to or greater than an energy difference between at least one energy level of a deep-level trap and the conduction band or between at least one energy level of a deep-level trap and the valence band.

7. The method of claim 1, wherein the second wavelength comprises 10.6 μm, and the semiconductor material comprises one of cadmium zinc telluride (CdZnTe), cadmium telluride (CdTe), zinc telluride (ZnTe), and gallium arsenide (GaAs).

8. The method of claim 1, wherein the first wavelength comprises a wavelength between 0.75 microns (μm) and 3.5 μm, and the second wavelength comprises a wavelength between 9 μm and 11 μm.

9. The method of claim 1, wherein the first light beam and the second light beam follow the same spatial path through the semiconductor material.

10. The method of claim 9, wherein the first light beam and the second light beam are in the semiconductor material at the same time.

11. The method of claim 1, wherein adjusting the property of the first light beam comprises increasing an intensity of the first light beam to reduce a maximum or average intensity of the first portion of the optical pulse.

12. The method of claim 1, wherein modifying one or more characteristics of the first portion of the formed optical pulse comprises reducing a maximum and/or average intensity of the first portion of the optical pulse.

13. An apparatus comprising:
   a modulation system comprising a semiconductor material; and
   a control system configured to:
      illuminate the semiconductor material of the modulation system with a first light beam having a first wavelength;
      apply a voltage to the semiconductor material for a time duration, the applied voltage being sufficient to modify an index of refraction of the semiconductor material such that a polarization state of a light beam having a second wavelength passing through the semiconductor material is modified to pass through at least one polarization-based optical element of the modulation system,
      form an optical pulse by passing a second light beam having the second wavelength through the semiconductor material during the time duration, wherein the formed optical pulse comprises a first portion and a second portion, the first portion and the second portion being temporally contiguous, the first portion occurring before the second portion, and
      adjust a property of the first light beam to adjust one or more characteristics of the first portion of the optical pulse, wherein illuminating the semiconductor material of the modulation system with the first light beam modifies one or more characteristics of the first portion of the formed optical pulse, wherein
      the apparatus is configured for use in an EUV light source, and the formed optical pulse has an energy sufficient to convert at least some target material to plasma that emits EUV light.

14. The apparatus of claim 13, further comprising:
   a first light source coupled to the control system, the first light source configured to produce the first light beam having the first wavelength; and
   a second light source coupled to the control system, the second light source configured to produce the second light beam having the second wavelength.

15. The apparatus of claim 14, wherein
   the second light source comprises a pulsed light source,
   the control system is coupled to the modulation system and the second light source, and the control system is configured to control the second light source to emit a pulse of light.

16. The apparatus of claim 15, wherein at least one pulse of first light beam and the second light beam are in the semiconductor material at the same time.

17. The apparatus of claim 14, wherein the control system is further configured to control the first light source to control one or more characteristics of the first portion of the optical pulse.

18. The apparatus of claim 17, wherein the one or more characteristics of the first portion comprise one or more of an average intensity, a maximum intensity, and a temporal duration.

19. The apparatus of claim 18, wherein the control system is configured to control an intensity of the first portion of the pulse by controlling the first light source.

20. The apparatus of claim 13, wherein the second light beam comprises a continuous light beam.

21. An EUV light source comprising:
a light generation module configured to produce a pulsed light beam having a first wavelength;
a modulation system positioned to interact with the pulsed light beam, the modulation system comprising a semiconductor material, wherein the semiconductor material is associated with a spectral transmission characteristic, the spectral transmission characteristic comprising a transmission region and an absorption edge wavelength, the absorption edge wavelength being the lowest wavelength on the transmission region, the first wavelength being in the transmission region;
a control system coupled to the modulation system, the control system configured to:
illuminate the semiconductor material of the modulation system with a seed light beam having a seed wavelength between the absorption edge wavelength and the first wavelength;
apply a voltage to the semiconductor material for a time duration, the applied voltage being sufficient to modify an index of refraction of the semiconductor material such that a polarization state of a light beam having the first wavelength passing through the semiconductor material is modified to pass through at least one polarization-based optical element of the modulation system, and
form an optical pulse by passing at least one pulse of the pulsed light beam through the semiconductor material during the time duration, wherein the formed optical pulse comprises a first portion and a second portion, the first portion and the second portion being temporally contiguous, the first portion occurring before the second portion, and illuminating the semiconductor material of the modulation system with the first light beam modifies one or more characteristics of the first portion of the formed optical pulse;
a vacuum vessel configured to receive a target material and the formed optical pulse, an interaction between the target material and the formed optical pulse producing a plasma that emits EUV light; and
at least one optical element in the vacuum vessel positioned to direct the EUV light toward an optical lithography system.

22. An apparatus comprising:
a modulation system comprising a semiconductor material, wherein the semiconductor material is associated with a spectral transmission characteristic, the spectral transmission characteristic comprising a transmission region and an absorption edge wavelength, the absorption edge wavelength being the lowest wavelength on the transmission region, a first wavelength being in the transmission region; and
a control system configured to:
illuminate the semiconductor material of the modulation system with a first light beam having the first wavelength, the first wavelength being between the absorption edge wavelength and a second wavelength;
apply a voltage to the semiconductor material for a time duration, the applied voltage being sufficient to modify an index of refraction of the semiconductor material such that a polarization state of a light beam having the second wavelength in the transmission region of the semiconductor material that passes through the semiconductor material is modified to pass through at least one polarization-based optical element of the modulation system, and
form an optical pulse by passing a second light beam having the second wavelength through the semiconductor material during the time duration, wherein the formed optical pulse comprises a first portion and a second portion, the first portion and the second portion are temporally contiguous, the first portion occurs before the second portion, and illuminating the semiconductor material of the modulation system with the first light beam modifies one or more characteristics of the first portion of the formed optical pulse, wherein
the apparatus is configured for use in an EUV light source, and the formed optical pulse has an energy sufficient to convert at least some target material to plasma that emits EUV light.

23. The apparatus of claim 22, wherein illuminating the semiconductor material of the modulation system with the first light beam modifies a maximum intensity, an average intensity, and/or a temporal duration of the first portion of the formed optical pulse.

24. The apparatus of claim 22, wherein illuminating the semiconductor material of the modulation system with the first light beam reduces a maximum intensity and/or an average intensity of the first portion of the formed optical pulse.

25. An apparatus comprising:
a modulation system comprising a semiconductor material, wherein the semiconductor material is associated with a band gap energy, the band gap energy being an energy difference between a valence band of the semiconductor material and a conduction band of the semiconductor material; and
a control system configured to:
illuminate the semiconductor material of the modulation system with a first light beam having a first wavelength, wherein a photon energy of the first wavelength is less than the band gap energy;
apply a voltage to the semiconductor material for a time duration, the applied voltage being sufficient to modify an index of refraction of the semiconductor material such that a polarization state of a light beam having a second wavelength in a transmission region of the semiconductor material that passes through the semiconductor material is modified to pass through at least one polarization-based optical element of the modulation system, and form an optical pulse by passing a second light beam having the second wavelength through the semiconductor material during the time duration, wherein the formed optical pulse comprises a first portion and a second portion, the first portion and the second portion are temporally contiguous, the first portion occurs before the second portion, and illuminating the semiconductor material of the modulation system with the first light beam modifies one or more characteristics of the first portion of the formed optical pulse, wherein the apparatus is configured for use in an EUV light source, and the formed optical pulse has an energy sufficient to convert at least some target material to plasma that emits EUV light.

26. The apparatus of claim 25, wherein illuminating the semiconductor material of the modulation system with the first light beam modifies a maximum intensity, an average intensity, and/or a temporal duration of the first portion of the formed optical pulse.

27. The apparatus of claim 25, wherein illuminating the semiconductor material of the modulation system with the first light beam reduces a maximum intensity and/or an average intensity of the first portion of the formed optical pulse.

* * * * *